United States Patent
Ha

(10) Patent No.: US 9,148,602 B2
(45) Date of Patent: Sep. 29, 2015

(54) IMAGE SENSOR

(71) Applicant: Man Lyun Ha, Icheon-si (KR)

(72) Inventor: Man Lyun Ha, Icheon-si (KR)

(73) Assignee: Dongbu HiTek Co., Ltd., Bucheon-si (KR)

( * ) Notice: Subject to any disclaimer, the term of this patent is extended or adjusted under 35 U.S.C. 154(b) by 338 days.

(21) Appl. No.: 13/763,378

(22) Filed: Feb. 8, 2013

(65) Prior Publication Data

US 2014/0117204 A1    May 1, 2014

(30) Foreign Application Priority Data

Oct. 31, 2012   (KR) .................. 10-2012-0121946

(51) Int. Cl.
| | | |
|---|---|---|
| *H01L 27/00* | (2006.01) | |
| *H04N 5/378* | (2011.01) | |
| *H01L 27/146* | (2006.01) | |
| *H04N 5/355* | (2011.01) | |
| *H04N 5/357* | (2011.01) | |
| *H04N 5/3745* | (2011.01) | |

(52) U.S. Cl.
CPC .......... *H04N 5/378* (2013.01); *H01L 27/14609* (2013.01); *H04N 5/3559* (2013.01); *H04N 5/3575* (2013.01); *H04N 5/37452* (2013.01)

(58) Field of Classification Search
CPC ................... H01L 27/14609; H01L 27/14612; H04N 5/355; H04N 5/35527; H04N 5/3559

USPC ............ 250/208.1, 214 R, 214 DC; 348/295, 348/297, 302, 303, 308

See application file for complete search history.

(56) References Cited

U.S. PATENT DOCUMENTS

| | | | |
|---|---|---|---|
| 7,829,832 B2 | 11/2010 | Mauritzson et al. | |
| 8,847,136 B2 * | 9/2014 | Ayers et al. | ................ 250/208.1 |
| 2006/0249731 A1 * | 11/2006 | Ladd | ............................. 257/59 |
| 2007/0045681 A1 | 3/2007 | Mauritzson et al. | |

FOREIGN PATENT DOCUMENTS

| | | |
|---|---|---|
| JP | 2006-148328 | 6/2006 |
| JP | 2006-303768 A | 11/2006 |
| JP | 2007-088972 A | 4/2007 |
| KR | 20080038446 | 5/2008 |

OTHER PUBLICATIONS

Notice of Allowance for Korean Patent Application No. 10-2012-0121946; May 23, 2014.
Abstract for KR 10-2008-0038446A; http://engpat.kipris.or.kr; May 6, 2008.
Abstract for JP 2006-148328A; http://worldwide.espacenet.com; Jun. 8, 2006.

(Continued)

*Primary Examiner* — Kevin Pyo
(74) *Attorney, Agent, or Firm* — Andrew D. Fortney; Central California IP Group, P.C.

(57) ABSTRACT

An image sensor includes a pixel array including a plurality of unit pixels, each having a photodiode, a transfer transistor, a reset transistor, a drive transistor, and a select transistor, an analog to digital converter for sampling an analogous sensing signal from the pixel array and converting the analogous sensing signal into a digital sensing signal, and a timing controller for forwarding a transfer signal which turns on the transfer transistor until after sampling the sensing signal.

19 Claims, 6 Drawing Sheets

(56) References Cited

OTHER PUBLICATIONS

Abstract for JP 2007-088972A; http://www19.ipdl.inpit.go.jp; Apr. 5, 2007.
Abstract for JP 2006-303768A; http://www19.ipdl.inpit.go.jp; Nov. 2, 2006.
Kasuga Shigetaka, et al., Patent Abstracts of Japan: JP2006148328, Abstract of JP2006148328, Jun. 8, 2006, 1 page, Japan.
Richard Mauritzson, et al., Espacenet Bibliographic Data: KR20080038446, Abstract of KR20080038446, May 6, 2008, 2 pages, Korea.
Man Lyun Ha, Korean Office Action issued Nov. 19, 2013, Korea Application 10-2012-0121946 filed Oct. 31, 2012, Entitled "Image Sensor".

* cited by examiner

IMAGE SENSOR

CROSS REFERENCE TO RELATED APPLICATION

This application claims the benefit of Korean Patent Application No. 10-2012-0121946, filed on Oct. 31, 2012, which is hereby incorporated by reference as if fully set forth herein.

BACKGROUND OF THE DISCLOSURE

1. Field of the Disclosure

Embodiments of the present invention relate to an image sensor with an improved dynamic range.

2. Discussion of the Related Art

The image sensor is a semiconductor device for converting an optical image to an electric signal. In the image sensors, there are CCD (Charge Coupled Device) type devices and CMOS (Complementary Metal-Oxide-Silicon) type devices.

The CCD (Charge Coupled Device) has a complicated driving system, high power consumption, complicated fabrication process due to many masking steps, and difficulty in fabricating into one chip because a signal processing circuit cannot be integrated to the chip. In contrast, the CMOS image sensor is widely used owing to its low power consumption, a fabrication process simpler than the CCD fabrication process, and the possibility to fabricate as and integrate signal processing circuitry onto one chip.

In expressing a quality of the image sensor, one of the important criteria is dynamic range. In general, the dynamic range is a maximum range in which a signal can be processed without distortion of the signal. The image sensor can obtain a better image regardless of the range of illuminance change if the dynamic range increases.

SUMMARY OF THE DISCLOSURE

Accordingly, the present invention is directed to an image sensor.

An object of the present invention is to provide an image sensor which can improve a dynamic range in a high illuminance environment.

Additional advantages, objects, and features of the disclosure will be set forth in part in the description which follows and in part will become apparent to those having skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose(s) of the invention, as embodied and broadly described herein, an image sensor includes a pixel array including a plurality of unit pixels each having a photodiode, a transfer transistor, a reset transistor, a drive transistor, and a select transistor, an analog to digital converter configured to sample an analogous sensing signal from the pixel array and convert the sampled analogous sensing signal into a digital sensing signal, and a timing controller configured to forward a transfer signal which maintains a turned on state of the transfer transistor until a time after sampling the sensing signal is completed.

The analog to digital converter may sample a first sensing signal from the unit pixel which is reset, and a second sensing signal from the unit pixel in correspondence to an external image signal.

The transfer signal may be activated between a time when sampling the first sensing signal is completed and a time when sampling the second sensing signal is begun, and inactivated after a time when sampling the second sensing signal is completed.

The time that the transfer signal is active may be between completing sampling of the first sensing signal and initiating sampling of the second sensing signal, and the time when the transfer signal is inactive may be after completing sampling of the second sensing signal.

The unit pixel may further include a first capacitor between a sensing node where the transfer transistor and the drive transistor meet and a ground potential or power source, and a first switch between the first capacitor and the sensing node. The timing controller may turn on the first switch before a time when the transfer transistor is turned on.

The analog to digital converter may include a CDS (Correlated Double Sampling) processing unit configured to sample the first sensing signal and the second sensing signal, differentially amplify the sampled first sensing signal and the sampled second sensing signal, and forward the differentially amplified signals, and an analog to digital converting unit configured to compare the differentially amplified signal(s) to a reference signal and forward a digital code according to a result of the comparison.

The CDS processing unit may include a differential amplifier having a first input terminal and a second input terminal. The CDS processing unit forwards the differentially amplified signal, and further includes a second switch between an output terminal of the unit pixel and the first input terminal, the first input terminal sampling the first sensing signal in accordance with a first control signal. The CDS processing unit also includes a second capacitor between the first input terminal and the ground potential or power source for storing the first sensing signal therein, a third switch between the output terminal of the unit pixel and the second input terminal, the second input terminal sampling the second sensing signal in accordance with a second control signal The CDS processing unit further includes a third capacitor between the second input terminal and the ground potential or power source for storing the second sensing signal therein.

The timing controller may forward the first control signal and the second control signal, and the transfer signal may be active between a time when the first control signal is inactive and a time when the second control signal is active, and inactive after a time when the second control signal is inactive.

Advantageous Effects

Embodiment(s) of the invention can improve the dynamic range of a CMOS image sensor in a high illuminance environment.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle(s) of the disclosure. In the drawings.

DESCRIPTION OF SPECIFIC EMBODIMENTS

Reference will now be made in detail to specific embodiments of the present invention, examples of which are illustrated in the accompanying drawings. In the description of such embodiments, if it is described that a layer, a film, a region, a pattern, or a structure is formed "on" or "under" a substrate, a layer, a film, a region, a pad, or a pattern, the terms "on" and "under" imply that the layer, the film, the region, the pattern, or the structure is formed "on" or "under" the substrate, and one or more other layers, films, regions, pads, or patterns directly or indirectly disposed therebetween. And, a reference to the "on" or "under" may be in a corresponding drawing.

A size in a drawing can be exaggerated, omitted or shown schematically for convenience and clarity of description. And, a size of an element may not be shown to scale, perfectly. And, the same reference number refers to the same element(s) throughout description and/or the drawings. An image sensor of the present invention will be described with reference to the attached drawings.

Figure 1:
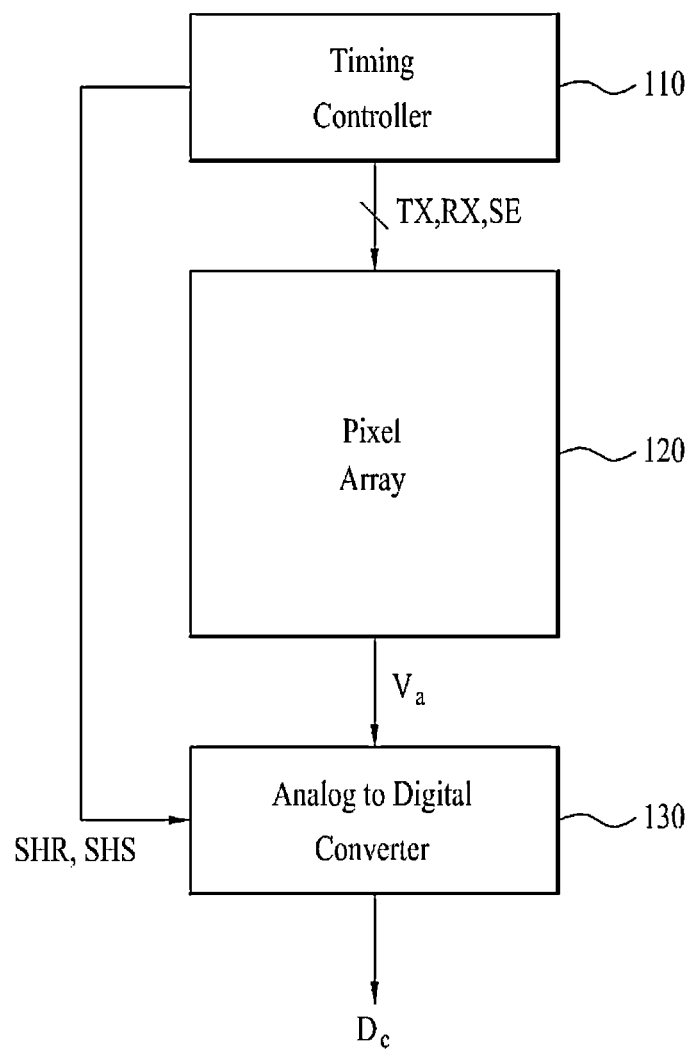
FIG. 1 illustrates a block diagram of an image sensor in accordance with an embodiment of the invention.

FIG. 1 illustrates a block diagram of an image sensor in accordance with an embodiment of the invention.

Referring to FIG. 1, the image sensor includes a timing controller 110, a pixel array 120, and an analog to digital converter 130.

The timing controller 110 forwards control signals (for example, a reset signal RX, a transfer signal TX, and a selection signal SE) for controlling the pixel array 120, and control signals (for example, a first control signal SHR, and a second control signal SHS) for controlling the analog to digital conversion block 130.

The pixel array 120 includes a matrix of unit pixels. The unit pixel may be a photoelectric conversion device for sensing and converting light into an electric signal.

Figure 2:
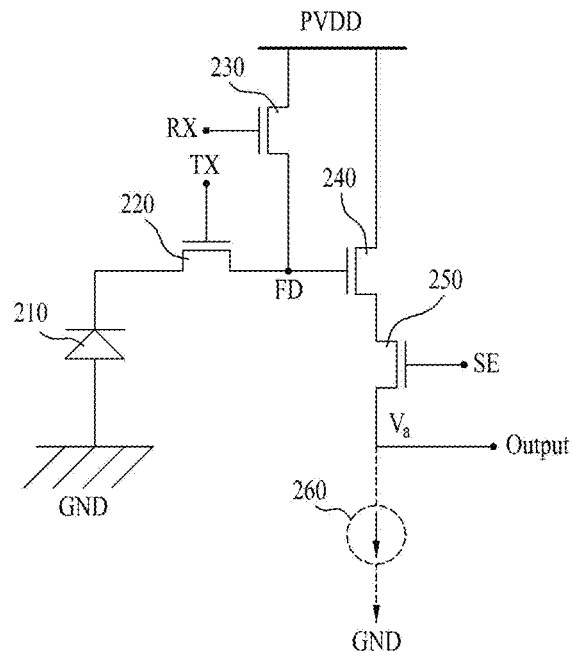
FIG. 2 illustrates a circuit diagram of the unit pixel in the pixel array shown in FIG. 1 in accordance with an embodiment of the invention.

FIG. 2 illustrates a circuit diagram of the unit pixel in the pixel array shown in FIG. 1 in accordance with an embodiment.

Referring to FIG. 2, the unit pixel in the pixel array 120 may include a photodiode 210, a transfer transistor 220, a reset transistor 230, a driver transistor 240, a select transistor 250, and a current source 260.

The photodiode 210 is connected between a first potential or power source GND and the transfer transistor 220, and generates an electric charge upon absorption of light. For example, the first power source GND may be a ground potential.

The transfer transistor 220 is connected between a sensing node FD and the photodiode 210 and may be controlled by the transfer signal TX applied thereto from the timing controller 110. The transfer transistor 220 may transmit the electric charge generated by the photodiode 210 to the sensing node FD in response to the transfer signal TX. In this case, the sensing node FD may be a floating diffusion region.

The reset transistor 230 is connected between a second power source PVDD and the sensing node FD and may be controlled by the reset signal RX applied thereto from the timing controller 110. The reset transistor 230 may serve resetting the unit pixel in response to the reset signal RX.

The drive transistor 240 may be connected between the first power source PVDD and one end or terminal (for example, a source or a drain) of the select transistor 250. The drive transistor 240 may have a gate connected to the sensing node FD. The drive transistor 240 may be controlled in response to a voltage on the sensing node FD. The drive transistor 240 may form a source follower together with the current source 260, and may serve as a buffer.

The select transistor 250 may be connected between the drive transistor 240 and the current source 260, controlled by the select signal SE applied thereto from the timing controller 110, and forward the sensing signal Va to an output terminal Output.

Figure 3:
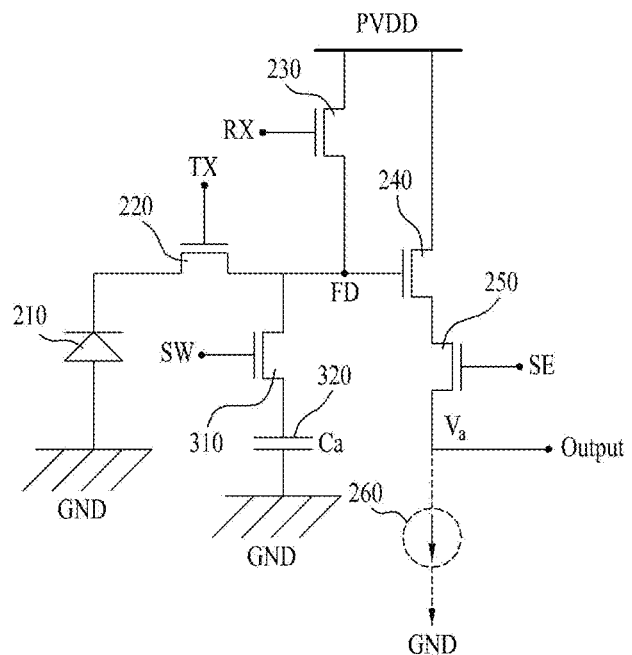
FIG. 3 illustrates a circuit diagram of the unit pixel in the pixel array shown in FIG. 1 in accordance with another embodiment of the invention.

FIG. 3 illustrates a circuit diagram of a unit pixel in the pixel array 120 shown in FIG. 1 in accordance with another embodiment. Reference numbers in FIG. 3 the same with the reference numbers in FIG. 2 denote the same elements respectively, and description duplicated with the foregoing description will be omitted or briefed.

Referring to FIG. 3, the unit pixel in the pixel array 120 may further include a first switch 310 and a first capacitor 320 as compared to the unit pixel in FIG. 2.

The first capacitor 320 may be connected between the sensing node FD and the first power source or terminal GND. The first switch 310 may be connected between the first capacitor 320 and the sensing node FD, and may be controlled by a first control switch control signal SW applied thereto from the timing controller 110. That is, the first switch 310 may connect the first capacitor 320 to the sensing node FD or may disconnect the first capacitor 320 from the sensing node FD in response to the first switch control signal SW.

Referring back to FIG. 1, the analog to digital converter 130 may sample an analogous sensing signal Va from the pixel array 120, and may convert the sampled sensing signal Va to a digital signal Dc. The analog to digital converter 130 may carry out CDS (Correlated Double Sampling) for removing fixed pattern noise peculiar to the pixel. The CDS may comprise calculating a difference Dsig–Drst, where Drst is a value of first digital data on a first sensing signal Vret forwarded from the unit pixel when the unit pixel is reset (e.g., the sensing node FD is brought to a first predetermined voltage VDD), and Dsig is a value of second digital data on a second sensing signal forwarded from the unit pixel corresponding to an external image signal (e.g., when the current or voltage at the output node Va is sensed and the unit pixel is read).

Figure 4:
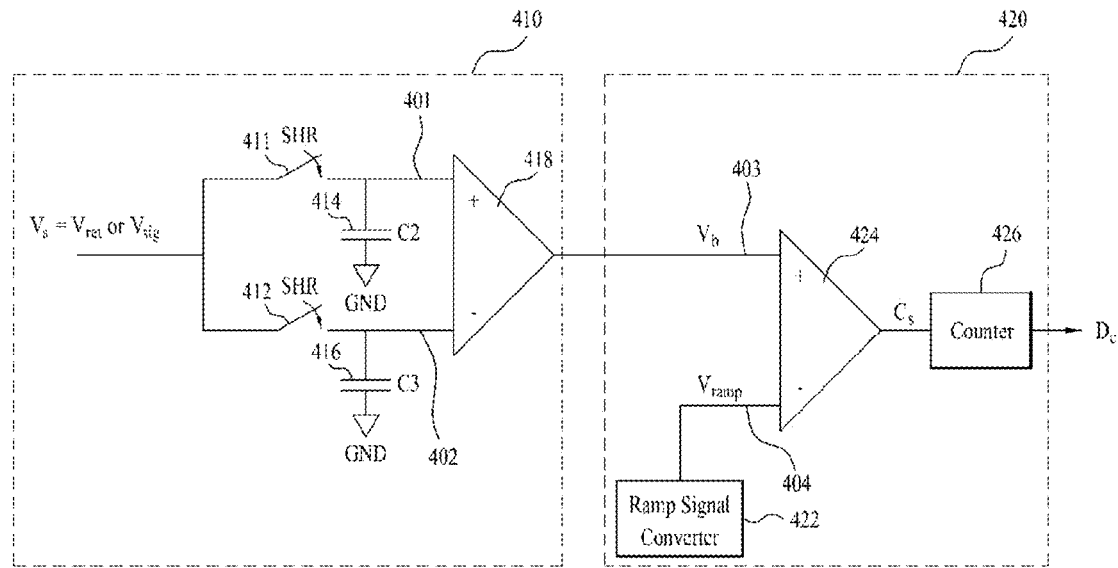
FIG. 4 illustrates a circuit diagram of the analog to digital converter shown in FIG. 1 in accordance with an embodiment of the invention.

FIG. 4 illustrates a circuit diagram of the analog to digital converter 130 shown in FIG. 1 in accordance with an embodiment. As shown in FIG. 4, the analog to digital converter 130 may include a CDS (Correlated Double Sampling) processing unit 410 and an analog to digital converting unit 420.

The CDS processing unit 410 may sample the first sensing signal Vret and the second sensing signal Vsig from the unit pixel, differentially amplify the sampled first sensing signal Vret and the sampled second sensing signal Vsig, and forward an analogous differentially amplified signal Vb. For example, the CDS processing unit 410 may include a second switch 411, a second capacitor 414, a third switch 412, a third capacitor 416, and a differential amplifier 418 having a first input terminal 401 and a second input terminal 402.

The second switch 411 is connected between an output terminal of the unit pixel of the pixel array 120, and the first input terminal 401 of the differential amplifier 418, and may be controlled by a first control signal SHR applied thereto from the timing controller 110. The second capacitor 414 may be connected between the first input terminal 401 of the differential amplifier 418 and the first power source or terminal GND and may store the first sensing signal Vret therein.

The third switch 412 is connected between the output terminal of the unit pixel of the pixel array 120 and the second input terminal 402 of the differential amplifier 418, and may be controlled by a second control signal SHS applied thereto from the timing controller 110. The third capacitor 416 may be connected between the second input terminal 402 of the first control signal SHR and the first power source or terminal GND and may store the second sensing signal Vsig therein.

The timing controller 110 may turn on the second switch 411 with the first control signal SHR and turn off the third switch 412 with the second control signal SHS to sample the first sensing signal Vret from the unit pixel and to store the sampled first sensing signal Vret in the second capacitor 414. And, the timing controller 110 may turn off the second switch 411 with the first control signal SHR, and turn on the third switch 412 with the second control signal SHS to sample the second sensing signal Vsig from the unit pixel and store the sampled second sensing signal Vsig in the third capacitor 416.

The differential amplifier 418 may differentially amplify the first sensing signal Vret stored in the second capacitor 414 and the second sensing signal Vsig stored in the third capacitor 416, and may forward a differentially amplifies signal Vb.

The analog to digital converting unit 420 may compare the differentially amplified signal Vb to a reference signal Vramp, and may forward a digital code Dc according to a result of the comparison.

The analog to digital converting unit 420 may include a ramp signal generator 422, a comparator 424, and a counter 426. The ramp signal generator 422 may generate an analog ramp signal Vramp. The comparator 424 may include a first input terminal 403 receiving the differentially amplified signal Vb and a second input terminal 404 receiving the analog ramp signal Vramp, and compares the differentially amplified signal Vb to the analog ramp signal Vramp and forwards a comparison signal Cs, which is an analog signal. The counter 426 may count the comparison signal Cs from the comparator 424, and may forward the digital output code Dc with reference to the count. Other forms of analog-to-digital converters may also be employed in the present invention.

Figure 5:
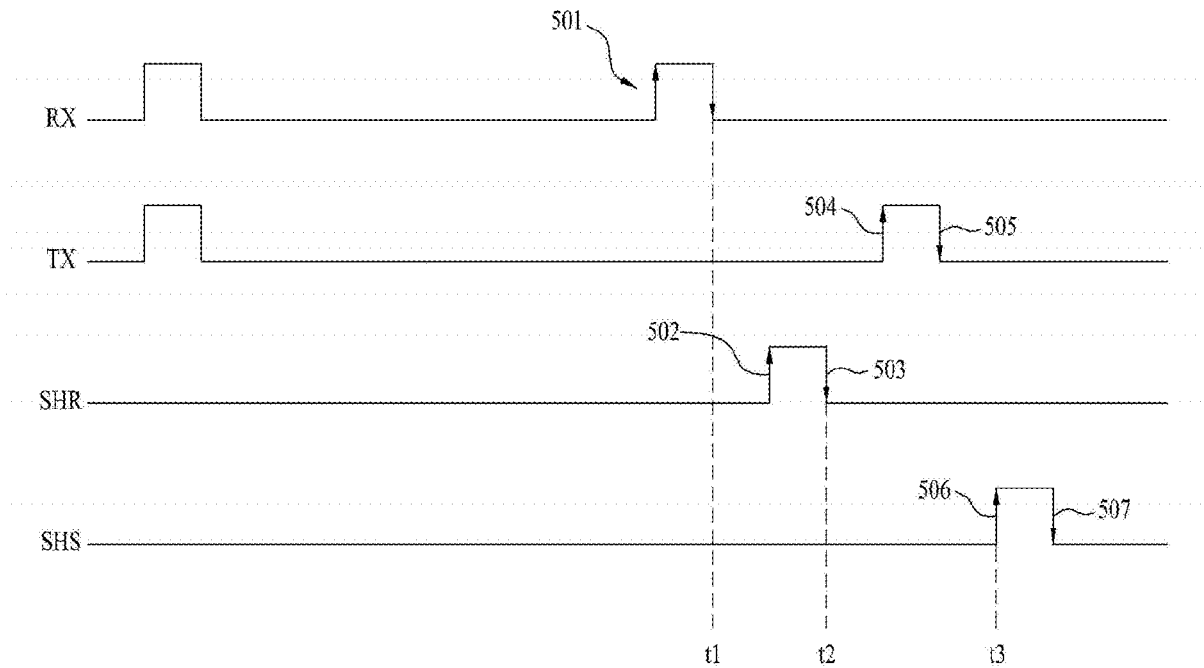
FIG. 5 illustrates a timing diagram of a reset signal for sampling a first sensing signal and a second sensing signal, a transfer signal, a first control signal, and a second control signal in a first illuminance environment.

FIG. 5 illustrates a timing diagram of the reset signal for sampling the first and second sensing signals, a transfer signal, a first control signal, and a second control signal in a first illuminance environment. In this case, the first illuminance environment may be an environment in which illuminance is lower than an illuminance preset by the user (for example, a low illuminance environment, which may be defined by a predetermined illuminance set by the user).

A process for sampling the first sensing signal Vret and the second sensing signal Vsig in the low illuminance environment will be described.

Referring to FIG. 5, at first, the timing controller 110 activates the reset signal 501, and resets the unit pixel with the active reset signal. The unit pixel reset thus may forward the first sensing signal Vret.

In order to sample the first sensing signal Vret at the second capacitor 414, the timing controller 110 may activate the first control signal SHR (e.g., by causing it to have a first level [for example, a high logic level]) as shown at 502 after a time point t1 when resetting the unit pixel is complete. In this case, the second control signal SHS from the timing controller 110 may be inactive and have a second level (for example, a low logic level).

In order for the unit pixel to obtain image information, the timing controller 110 may activate the transfer signal TX at 504 (e.g., by causing it to have the first level) after a time point t2 when sampling the first sensing signal Vret is complete (503). In this case, the time point t2 when sampling of the first sensing signal Vret is complete may be a time point when the first control signal SHR is inactive (e.g., has the second level at 503). The second sensing signal Vsig may be forwarded from the unit pixel, which then finishes obtaining the image information.

The timing controller 110 inactivates the transfer signal TX at 505 (e.g., by causing it to have the second level) before a time point t3 when sampling the second sensing signal Vsig is begun (506). In order to sample the second sensing signal Vsig at the third capacitor 416, the timing controller 110 activates the second control signal SHS (e.g., by causing it to have the first level (506). In this case, the first control signal SHR forwarded from the timing controller 110 may be inactive (e.g., the first control signal SHR has the second level).

In order to sample the first sensing signal Vret and the second sensing signal Vsig in the first illuminance environment (for example, the low illuminance environment), the timing controller 110 may forward the transfer signal TX which is activated at 504 after the time point t2 when the sampling of the first sensing signal Vret is finished (503), and inactivated at 505 before the time point t3 when the sampling of the second sensing signal Vsig is started (506).

Figure 6:
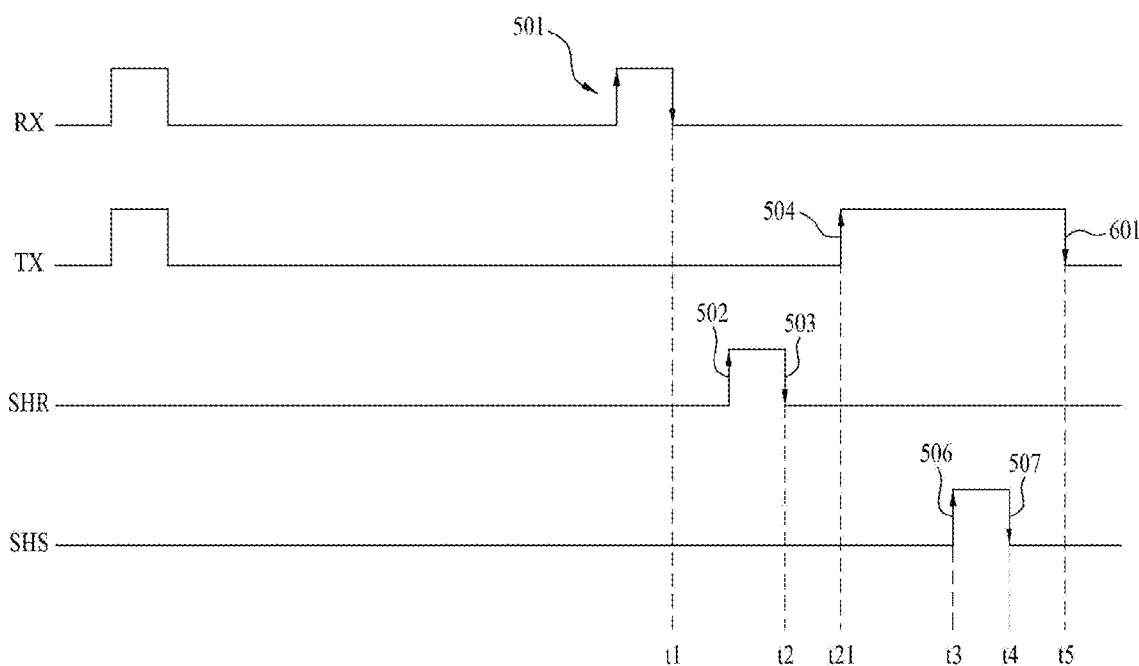
FIG. 6 illustrates a timing diagram of a reset signal for sampling a first sensing signal and a second sensing signal, a transfer signal, a first control signal, and a second control signal in a second illuminance environment.

FIG. 6 illustrates a timing diagram of the reset signal RX for sampling the first sensing signal and the second sensing signal, the transfer signal TX, the first control signal SHR, and the second control signal SHS in a second illuminance environment. In this case, the second illuminance environment may refer to an environment which has an illuminance (for example, the high illuminance environment) higher than the predetermined illuminance preset by the user.

A process for sampling the first sensing signal Vret and the second sensing signal Vsig in the high illuminance environment will be described.

Referring to FIG. 6, the timing controller 110 activates the reset signal RX at 501, and resets the unit pixel with the active reset signal RX. The reset unit pixel may forward the first sensing signal Vret.

In order to sample the first sensing signal Vret at the second capacitor 414, the timing controller 110 may activate the first control signal SHR (e.g., by causing it to have a first level [for example, a high logic level]) at 502, after a time point t1 when resetting the unit pixel is complete. In this case, the second control signal SHS from the timing controller 110 may be inactive (e.g., have a second level [for example, a low logic level]).

In order for the unit pixel to obtain image information, the timing controller 110 activates the transfer signal TX (e.g., by causing it to have the first level) at 504, after a time point t2 when sampling the first sensing signal Vret is complete (503).

In order to sample the second sensing signal Vsig at the third capacitor 416, the timing controller 110 activates the second control signal SHS (e.g., by causing it to have the first level) at 506, after a time point t2 when the transfer signal TX is activated (504). In this case, the first control signal SHR from the timing controller 110 may be inactive (e.g., the first control signal SHR has the second level). The second control signal SHS is inactivated at 507, and sampling of the second sensing signal Vsig may be complete.

In the high illuminance environment, the timing controller 110 may maintain the transfer signal TX at the first level while the second sensing signal Vsig is being sampled, and may inactivate the transfer signal TX (e.g., cause it to have the second level) at 601, after a time point t4 (507) when sampling the second sensing signal Vsig is complete.

The timing controller 110 may activate the transfer signal TX (e.g., cause it to have the first level) at 504, after the time point t2 when sampling the first sensing signal Vret is complete (503), and may inactivate the transfer signal TX at 601, after the time point t4 when sampling the second sensing signal Vsig is complete. That is, the time point t21 (504) when the transfer signal TX is activated may be between the time point t2 when sampling the first sensing signal Vret is complete and the time point t3 when sampling the second sensing signal Vsig is begun. In addition, the time point t5 when the transfer signal TX is inactivated may be after the time point t4 when sampling the second sensing signal Vsig is complete.

Since this embodiment suggests keeping the transfer transistor 220 on with the transfer signal TX while the second sensing signal Vsig is sampled in the high illuminance environment, the total capacitance of the sensing node FD may be the capacitance Cj of the sensing node FD itself plus the capacitance Cpd of the photodiode 210. Since the sensitivity of the image sensor is inversely proportional to the capacitance value of the sensing node FD, this embodiment can reduce the sensitivity of the unit pixel in the high illuminance environment and improve the dynamic range of the unit pixel by increasing the capacitance value of the sensing node FD.

Figure 7:
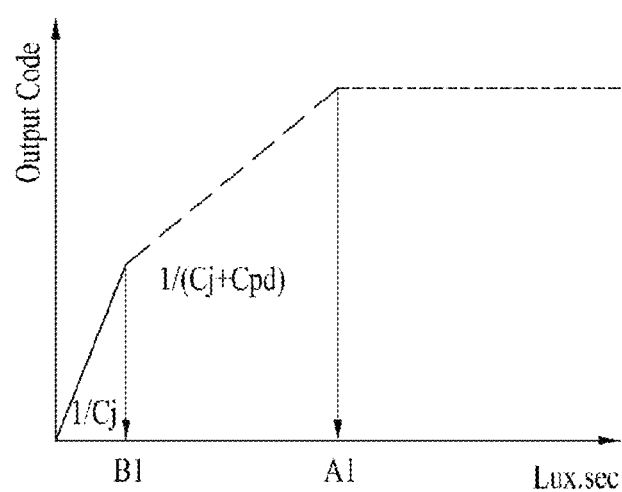
FIG. 7 illustrates a sensitivity graph of an image sensor in accordance with an embodiment in the second illuminance environment.

FIG. 7 illustrates a sensitivity graph of an image sensor in accordance with an embodiment in the second illuminance environment. FIG. 7 illustrates a sensitivity graph in a case where the unit pixel in the pixel array 120 is the unit pixel in FIG. 2, wherein the x-axis denotes illuminance x time and the y-axis denotes a digital output code Dc (e.g., from an analog-to-digital converter as described herein).

Referring to FIG. 6, in the high illuminance environment, the transfer transistor 220, turned on at a time point t21 after sampling the first sensing signal Vret is complete, maintains the on state until a time point t5 the sampling the second sensing signal Vsig is complete.

Referring to FIG. 7, though the capacitance of the sensing node FD is Cj before the transfer transistor 220 is turned on, the capacitance of the sensing node FD may be Cj+Cpd after a time point B1 when the transfer transistor 220 is turned on. Thus, embodiments of the invention can relatively improve the dynamic range of the unit pixel (and an image sensor including the same) by increasing the capacitance of the sensing node FD after the transfer transistor 220 is turned on, thereby decreasing the sensitivity, relatively.

Figure 8:
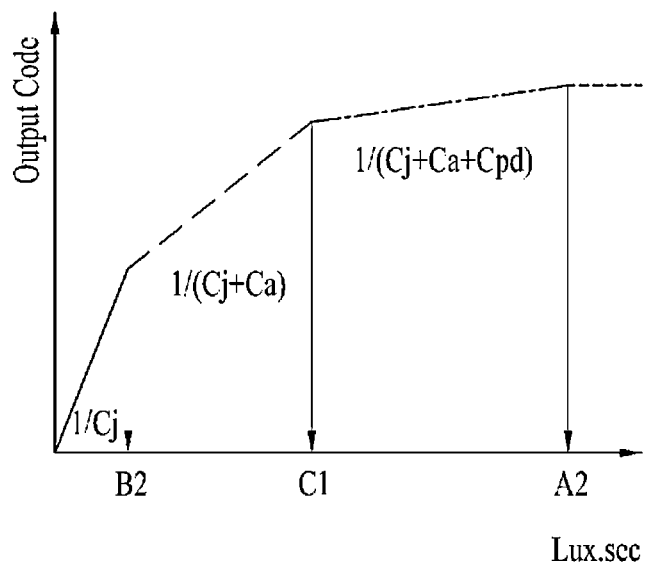
FIG. 8 illustrates a sensitivity graph of an image sensor in accordance with another embodiment in the second illuminance environment.

FIG. 8 illustrates a sensitivity graph of an image sensor in accordance with another embodiment in the second illuminance environment. FIG. 8 illustrates a case when the unit pixel of the pixel array 120 is the unit pixel shown in FIG. 3.

Referring to FIG. 8, the capacitance of the sensing node FD may be Cj before the transfer transistor 220 is turned on and the first switch 310 is turned on. The capacitance of the sensing node FD may be Cj+Ca if or when the first switch 310 is turned on at a time point B2, before the transfer transistor 220 is turned on. Furthermore, the capacitance of the sensing node FD may be Cj+Ca+Cpd at a time point C1 when the transfer transistor 220 is turned on.

Thus, embodiments of the invention can increase the capacitance of the sensing node FD by adjusting the turn-on time points of the first switch 310 and the transfer transistor 220, thereby decreasing the sensitivity of the unit pixel, and improving the dynamic range, relatively.

Figure 9:
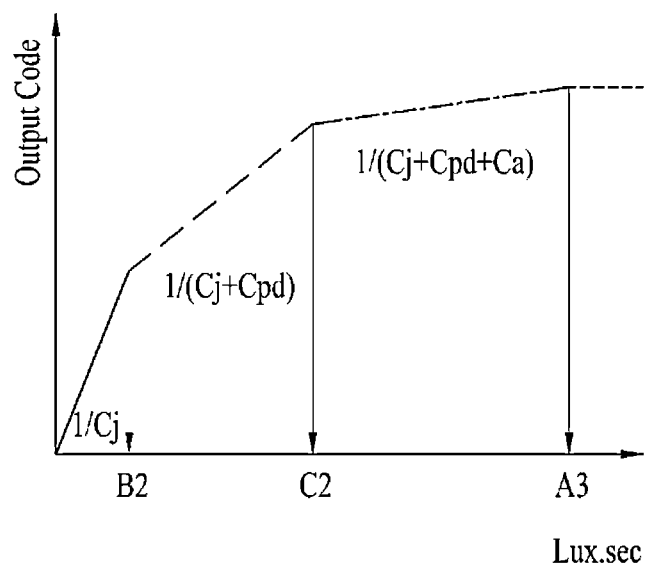
FIG. 9 illustrates a sensitivity graph of an image sensor in accordance with yet another embodiment in the second illuminance environment.

FIG. 9 illustrates a sensitivity graph of an image sensor in accordance with another embodiment in the second illuminance environment. FIG. 9 illustrates a case when the unit pixel in the pixel array 120 is the unit pixel shown in FIG. 3.

Though FIG. 8 illustrates a case when the first switch 310 is turned on at first and the transfer transistor 220 is turned on thereafter, the embodiment in FIG. 9 may be a case when the first switch 310 is turned on after the transfer transistor 220 is turned on.

Referring to FIG. 9, the capacitance of the sensing node FD may be Cj before the transfer transistor 220 is turned on and the first switch 310 is turned on. However, if or when the transfer transistor 220 is turned on, the capacitance of the sensing node FD may be Cj+Cpd at the time point B2 when the transfer transistor 220 is turned on. In addition, the capacitance of the sensing node FD may be Cj+Cpd+Ca if or when the first switch 310 is turned on at a time point C2, after the time point B2 when the transfer transistor 220 is turned on.

Figure 10:
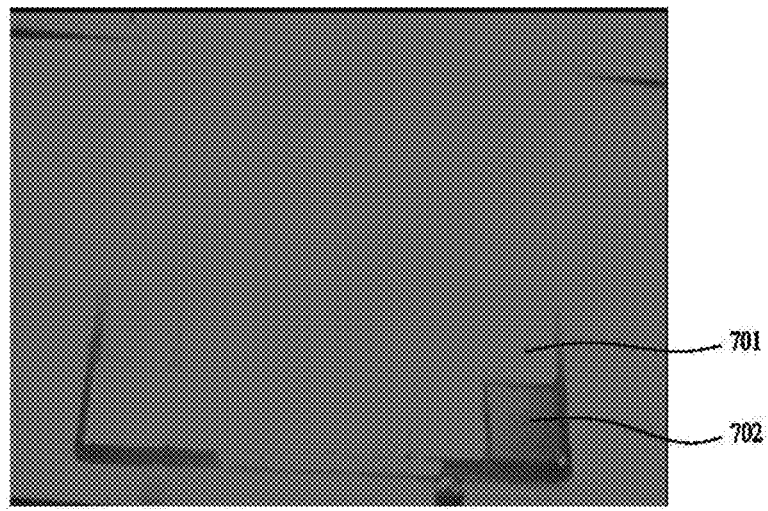
FIG. 10 illustrates a sampling image when the transfer transistor of the unit pixel is turned off in a high illuminance environment.
Figure 11:
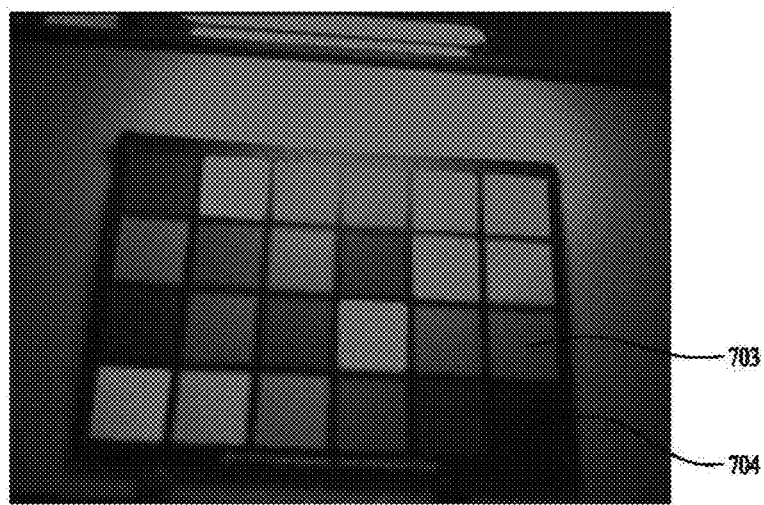
FIG. 11 illustrates a sampling image when the transfer transistor of the unit pixel is turned on in a high illuminance environment.

FIG. 10 illustrates a sampling image in a state where the transfer transistor of the unit pixel is turned off in the high illuminance environment, and FIG. 11 illustrates a sampling image in a state where the transfer transistor of the unit pixel is turned on in the high illuminance environment.

The sampling image illustrated in FIG. 10, already saturated with the high illuminance environment, is unable to make color patches (for example, 701 and 702) distinctive. In contrast to this, the sampling image illustrated in FIG. 11 is able to make the color patches 703 and 704 distinctive. Thus, by enabling maintenance of the resolution of the image sensor even in the high illuminance environment, embodiments of the invention can improve the dynamic range.

Characteristics, structures, effects, and so on described in above embodiments are included to at least one of embodiments, but not limited to only one embodiment invariably. Furthermore, it is apparent that the features, the structures, the effects, and so on described in the embodiments can be combined, or modified with other embodiments by persons skilled in this field of art. Therefore, such combinations and modifications are included within the scope of the present invention.

What is claimed is:

1. An image sensor comprising:
   a pixel array including a plurality of unit pixels, each unit pixel having a photodiode, a transfer transistor, a reset transistor, a drive transistor, a select transistor, a first capacitor, a sensing node, and a first switch between the first capacitor and the sensing node;
   an analog to digital converter comprising a second switch and a second capacitor in parallel with a third switch and a third capacitor, the analog to digital converter configured to sample first and second analog sensing signals from the pixel array, store the first analog sensing signal in the second capacitor and the second analog sensing signal in the third capacitor, and convert the sampled the first and second analog sensing signals into a digital sensing signal; and a timing controller configured to (i) activate a transfer signal which turns on the transfer transistor after sampling the first analog sensing signal, (ii) inactivate the transfer signal before sampling the second analog sensing signal in a low illuminance environment, (iii) inactivate the transfer signal after sampling the second analog sensing signal in a high illuminance environment, (iv) turn on the first switch before sampling the second analog sensing signal in the high illuminance environment, and (v) store the first analog sensing signal before activating the transfer signal and store the second analog sensing signal after activating the transfer signal in both low and high illuminance environments.

2. The image sensor as claimed in claim 1, wherein the analog to digital converter samples the first analog sensing signal from the unit pixel and the second analog sensing signal from the unit pixel in correspondence to an external image signal.

3. The image sensor as claimed in claim 2, wherein the timing controller is configured to activate the transfer signal between sampling the first analog sensing signal and initiating sampling of the second analog sensing signal, and inactivate the transfer signal after sampling the second analog sensing signal.

4. The image sensor as claimed in claim 2, wherein the first capacitor is between the sensing node and a ground potential or power source.

5. The image sensor as claimed in claim 4, wherein the timing controller turns on the first switch before the transfer transistor is turned on.

6. The image sensor as claimed in claim 4, wherein the sensing node is connected to the transfer transistor and the drive transistor.

7. The image sensor as claimed in claim 2, wherein the analog to digital converter comprises:

a correlated double sampling (CDS) processing unit configured to sample the first analog sensing signal and the second analog sensing signal, differentially amplify the sampled first analog sensing signal and the sampled second analog sensing signal, and forward the differentially amplified signal.

8. The image sensor as claimed in claim 7, wherein the analog to digital converter further includes:

an analog to digital converting unit configured to compare the differentially amplified signal to a reference signal, and forward a digital code according to a result of the comparison.

9. The image sensor as claimed in claim 7, wherein the CDS processing unit includes a differential amplifier having a first input terminal and a second input terminal, the differential amplifier configured to forward the differentially amplified signal.

10. The image sensor as claimed in claim 7, wherein the CDS processing unit further includes a second switch between an output terminal of the unit pixel and the first input terminal, wherein the second switch is configured to sample the first analog sensing signal with a first control signal.

11. The image sensor as claimed in claim 10, wherein the second capacitor is between the first input terminal and the ground potential or power source.

12. The image sensor as claimed in claim 11, wherein the third switch is between the output terminal of the unit pixel and the second input terminal, wherein the third switch is configured to sample the second analog sensing signal in response to a second control signal.

13. The image sensor as claimed in claim 10, wherein the third capacitor is connected between the second input terminal and the ground potential or power source.

14. The image sensor as claimed in claim 12, wherein the timing controller generates the first control signal and the second control signal.

15. The image sensor as claimed in claim 14, wherein the timing controller is configured to activate the transfer signal between a time when the first control signal is inactive and a time when the second control signal is active, and inactivate the transfer signal after a time when the second control signal is inactive.

16. The image sensor as claimed in claim 1, wherein the transfer transistor is between the sensing node and the photodiode.

17. The image sensor as claimed in claim 1, wherein the sensing node comprises a floating diffusion region.

18. The image sensor as claimed in claim 1, wherein the timing controller activates the first control signal at a first level after the unit pixel is reset.

19. The image sensor as claimed in claim 7, wherein the CDS is configured to calculate a difference between first digital data on the first sensing signal from the unit pixel when the unit pixel is reset and second digital data on the second sensing signal from the unit pixel corresponding to the external image signal.

* * * * *